(12) United States Patent
Kim et al.

(10) Patent No.: US 12,125,459 B2
(45) Date of Patent: Oct. 22, 2024

(54) DATA TRANSMISSION AND RECOVERY WITH ALGORITHMIC TRANSITION CODES

(71) Applicant: SAMSUNG DISPLAY CO., LTD., Yongin-si (KR)

(72) Inventors: Heen Dol Kim, Yongin-si (KR); Jong Soo Kim, Yongin-si (KR); Chae Hee Park, Yongin-si (KR); Ji Ye Lee, Yongin-si (KR); Young Suk Jung, Yongin-si (KR)

(73) Assignee: SAMSUNG DISPLAY CO., LTD, Yongin-si (KR)

( * ) Notice: Subject to any disclaimer, the term of this patent is extended or adjusted under 35 U.S.C. 154(b) by 147 days.

(21) Appl. No.: 17/863,791

(22) Filed: Jul. 13, 2022

(65) Prior Publication Data
US 2023/0098067 A1    Mar. 30, 2023

(30) Foreign Application Priority Data
Sep. 24, 2021  (KR) .................. 10-2021-0126567

(51) Int. Cl.
| | | |
|---|---|---|
| *H04L 7/033* | (2006.01) | |
| *G06F 13/42* | (2006.01) | |
| *G09G 5/00* | (2006.01) | |
| *H03M 5/06* | (2006.01) | |
| *H04L 7/00* | (2006.01) | |
| *H04L 25/49* | (2006.01) | |
| *H04L 25/493* | (2006.01) | |

(52) U.S. Cl.
CPC ......... *G09G 5/008* (2013.01); *G06F 13/4278* (2013.01); *G09G 2370/10* (2013.01); *H03M 5/06* (2013.01); *H04L 7/0008* (2013.01); *H04L 7/033* (2013.01); *H04L 25/4906* (2013.01); *H04L 25/493* (2013.01)

(58) Field of Classification Search
CPC .... G09G 5/008; G09G 2370/10; H04L 7/033; H04L 7/0008; H04L 25/49; H04L 25/4906; H04L 25/493; H03M 5/06; G06F 13/4278
See application file for complete search history.

(56) References Cited

U.S. PATENT DOCUMENTS

| | | | |
|---|---|---|---|
| 9,729,681 B2 | 8/2017 | Lee | |
| 2021/0227100 A1* | 7/2021 | Meyer | .................. H04J 3/0667 |
| 2021/0391974 A1* | 12/2021 | Fujisawa | .................. H04L 7/10 |

FOREIGN PATENT DOCUMENTS

KR   10-2021-0050359      5/2021

* cited by examiner

*Primary Examiner* — Douglas M Wilson
(74) *Attorney, Agent, or Firm* — F. Chau & Associates, LLC

(57) ABSTRACT

An embodiment of the present disclosure provides a data transmission method that transmits data in a clock-embedded manner, including: dividing the data into a plurality of data packets having a bit number of 'a'; determining a transition code including information on a first transition facilitating data packet and a second transition facilitating data packet having the same high-order bits ([a−1:1]) among the data packets; converting the plurality of data packets into transition ensuring data packets by using the transition code; and transmitting the transition code and the transition ensuring data packets.

20 Claims, 9 Drawing Sheets

FIG. 9

| Decimal | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Binary | 0000 | 0001 | 0010 | 0011 | 0100 | 0101 | 0110 | 0111 | 1000 | 1001 | 1010 | 1011 | 1100 | 1101 | 1110 | 1111 |
| MSB([3:1]) | 000 | | 001 | | 010 | | 011 | | 100 | | 101 | | 110 | | 111 | |
| Presence or absence | | X | X | | | X | X<br>D1 | X<br>D2 | | X | X | | | X | X | |

900

DATA TRANSMISSION AND RECOVERY WITH ALGORITHMIC TRANSITION CODES

CROSS-REFERENCE TO RELATED APPLICATION

This application claims priority under 35 U.S.C. § 119 to Korean Patent Application No. 10-2021-0126567, filed in the Korean Intellectual Property Office on Sep. 24, 2021, the entire contents of which are incorporated by reference.

TECHNICAL FIELD

The present disclosure relates to data transmission and recovery, and more particularly to data transmission and recovery based on algorithmic transition codes.

DISCUSSION OF RELATED ART

As information technology has developed, the role of display devices, which may be used to provide a connection medium between a user and information, has been highlighted. Accordingly, the use of display devices such as liquid crystal display (LCD) devices, organic light-emitting diode (LED) display devices, and the like, has increased.

A clock-embedded transceiver without a separate clock line uses data transitions such as from 0 to 1 or from 1 to 0 in order to recover clock data. For example, during data transmission, a method may be used in which a transmitter divides data into a predetermined number of bits to form a plurality of data packets, and encodes each data packet through a conversion code and a logic operation (e.g., XOR), and a receiver re-decodes the encoded data packets by using a conversion code.

SUMMARY

The present disclosure provides a data transmission method and a corresponding data recovery method that may be used to ensure data transition through an algorithm, rather than through a complex logical operation.

An embodiment of the present disclosure provides a data transmission method that transmits data in a clock-embedded manner, including: dividing the data into a plurality of data packets having a bit number of 'a', where 'a' is greater than one; determining a transition code including information on a first transition facilitating data packet and a second transition facilitating data packet having the same high-order bits ([a−1:1]) among the data packets; converting the plurality of data packets into transition ensuring data packets by using the transition code; and transmitting the transition code and the transition ensuring data packets.

When the bit number is 'a', the number of data values that is representable by the data may be $2^a$.

The determining of the transition code may further include grouping the data packets to include $2^{a-1}-1$ of the data packets per one transition code.

The first transition facilitating data packet and the second transition facilitating data packet may not be included in a group of the data packet.

In the transition code, the least significant bit ([0]) may be set as a complement of one of bits included in the high-order bits ([a−1:1]).

The bit number 'a' may be greater than two, and the converting of the plurality of data packets into the transition ensuring data packets may include: in a case in which a data packet not including a transition among the plurality of data packets exists, converting them into the first transition facilitating data packet when all bits of the data packet not including the transition are 0, and converting them into the second transition facilitating data packet when all bits of the data packet not including the transition are 1.

The data packet in which all the bits are 0 may correspond to data displaying a black grayscale, and the data packet in which all the bits are 1 may correspond to data displaying a white grayscale.

The least significant bit ([0]) of the first transition facilitating data packet may be 0, and the least significant bit ([0]) of the second transition facilitating data packet may be 1.

The converting of the plurality of data packets into the transition ensuring data packets may include converting a data packet including a transition among the plurality of data packets into a transition ensuring data packet having the same value.

An embodiment of the present disclosure provides a data recovery method that recovers data transmitted in a clock-embedded manner, including: as a method of recovering transition ensuring data to data packets, receiving a transition code and the transition ensuring data packets; and recovering the transition ensuring data packets to the data packets by using the transition code.

The number of bits of the plurality of data packets may be 'a', where 'a' is greater than one; and the transition code may include a first transition facilitating data packet and a second transition facilitating data packet having the same high-order bits ([a−1:1]) among the data packets.

In the transition code, the least significant bit ([0]) may be set as a complement of one of bits included in the high-order bits ([a−1:1]).

The number of bits 'a' may be greater than two, and the recovering of the transition ensuring data packets to the data packets may include: comparing the transition ensuring data with the transition code; converting a transition ensuring data packet into a data packet in which the bits thereof are 0, when the high-order bits ([a−1:1]) of the transition ensuring data is the same as the high-order bits ([a−1:1]) of the transition code and when the least significant bit ([0]) of the transition ensuring data is 0; converting a transition ensuring data packet into a data packet in which the bits thereof are 1, when the high-order bits ([a−1:1]) of the transition ensuring data is the same as the high-order bits ([a−1:1]) of the transition code and when the least significant bit ([0]) of the transition ensuring data is 1.

The data packet in which the bits are 0 may correspond to data displaying a black grayscale, and the data packet in which the bits are 1 may correspond to data displaying a white grayscale.

The recovering of the transition ensuring data packets to the data packets may include converting a transition ensuring data packet into a data packet having the same value as the transition ensuring data when the high-order bits ([a−1:1]) of the transition ensuring data is not the same as the high-order bits ([a−1:1]) of the transition code.

When the number of the bits is 'a', the number of data values that is representable by the data may be $2^a$.

In the receiving of the transition code and the transition ensuring data, the transition code and the transition ensuring data may be received in units of groups, and the group may include $2^{a-1}-1$ of the transition ensuring data per one transition code.

An embodiment of the present disclosure provides a transceiver comprising: a transmitter including a transmission controller, at least one encoder connected to the transmission controller, and at least one transmitter unit connected to the at least one encoder, respectively; and a receiver coupled in signal communication with the transmitter, the receiver including at least one receiver unit, at least one decoder connected to the at least one receiver unit, respectively, and a reception controller connected to the at least one decoder.

The transceiver may be configured wherein the at least one encoder is configured to divide clock-embedded data into a plurality of data packets each having a bit number of 'a', where 'a' is greater than one, determine a transition code including information on a first transition facilitating data packet and a second transition facilitating data packet having the same high-order bit or bits ([a−1:1]) among the data packets, and convert the plurality of data packets into transition ensuring data packets by using the transition code, wherein the at least one transmitter unit is configured to transmit the transition code and the transition ensuring data packets.

The transceiver may be configured wherein the at least one receiver unit is configured to receive a transition code and the transition ensuring data packets, wherein the at least one decoder unit is configured to recover the transition ensuring data packets to the data packets by using the transition code, wherein the number of bits of each of the plurality of data packets is 'a', wherein 'a' is greater than one, wherein the transition code includes a first transition facilitating data packet and a second transition facilitating data packet having the same high-order bit or bits ([a−1:1]) among the data packets.

The transceiver may be configured wherein the number of bits a' is greater than two.

According to a data transmission method, a data recovery method, and a transceiver of the present disclosure, it is possible to ensure data transition through a relatively simple algorithm instead of a complex logical operation.

BRIEF DESCRIPTION OF THE DRAWINGS

FIG. 9 is a table for explaining a method of determining a first transition facilitating data packet and a second transition facilitating data packet when a bit depth of a data packet is 'a' according to an embodiment of the present disclosure.

DETAILED DESCRIPTION

Figure 1:
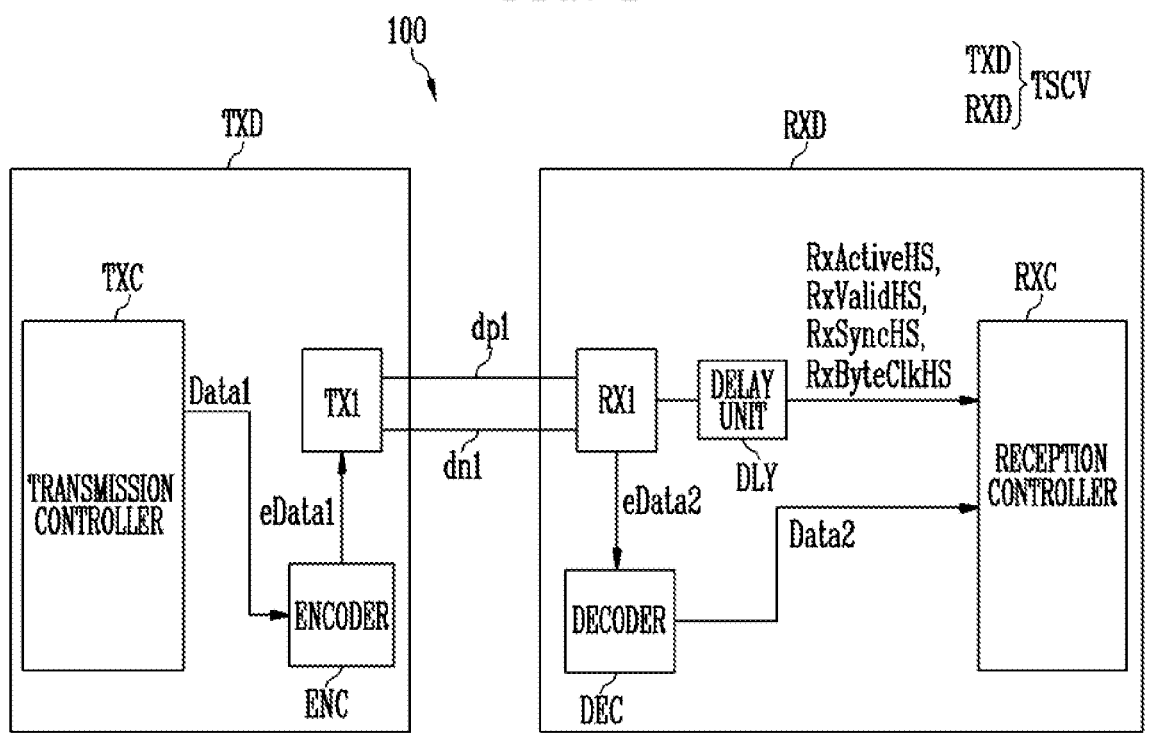
FIG. 1 and FIG. 2 are schematic block diagrams for explaining a transceiver according to an embodiment of the present disclosure.

The present disclosure will be described more fully hereinafter with reference to the accompanying drawings, in which illustrative embodiments are shown. As those skilled in the art would recognize, the described embodiments may be modified in various ways without departing from the spirit or scope of the present disclosure.

In order to clearly describe the present disclosure, parts or portions that are irrelevant to the description may be omitted for brevity, and identical or similar constituent elements throughout the specification may be denoted by the same or like reference numerals or indicia. Therefore, the same or like reference indicia may be used in multiple figures without repetitive description thereof.

Further, in the drawings, the size and thickness features of elements may be arbitrarily illustrated for ease of description, and the present disclosure is not necessarily limited to those features as illustrated in the drawings. In particular, the thicknesses of layers, films, panels, regions, areas, and the like may be exaggerated for clarity or ease of description without limitation thereto.

In addition, the expressions "equal to" and/or "same as", as may be used in the description, may mean "substantially equal to" and/or "substantially same as". For example, it may be similar enough to those skilled in the art to be considered the same for various purposes, without being literally or figuratively identical. Additional expressions may be expressions from which "substantially" is omitted for brevity but otherwise implicit therein.

Figure 2:
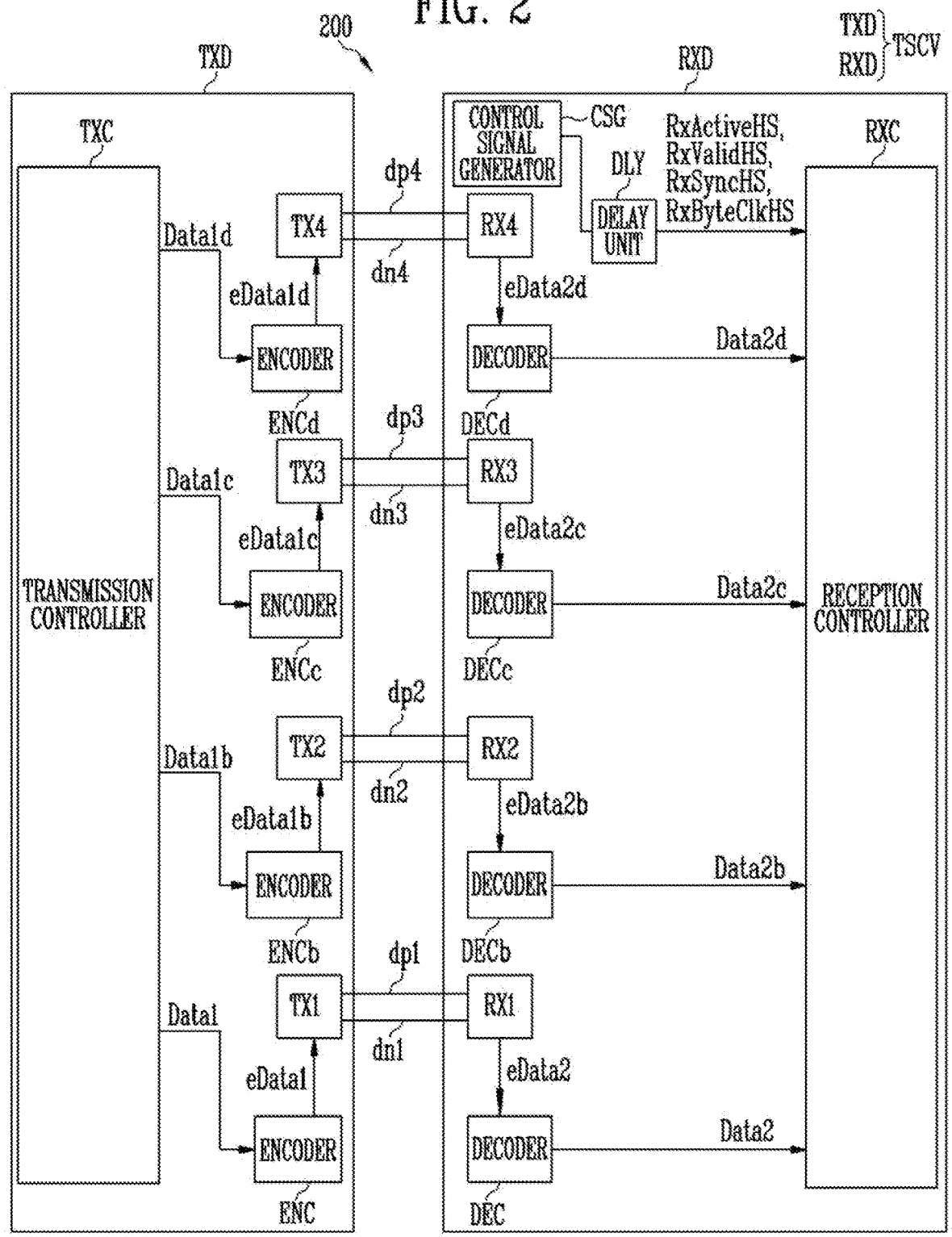

FIG. 1 and FIG. 2 show transceivers 100 and 200, each according to an embodiment of the present disclosure.

Referring to FIG. 1 and FIG. 2, a transceiver TSCV according to an embodiment may include a transmitter TXD and a receiver RXD.

The transmitter TXD may include a transmission controller TXC, at least a first data transmitting unit TX1, and at least one encoder ENC. The receiver RXD may include a reception controller RXC, at least a first data receiving unit RX1, at least one decoder DEC, and a delay unit DLY.

The first data transmitting unit TX1 may be connected to the first data receiving unit RX1 through a first line dp1 and a second line dn1. The first data transmitting unit TX1 and the first data receiving unit RX1 may be referred to as a first data channel. The first data transmitting unit TX1 and the first data receiving unit RX1 may correspond to a physical layer and a data link layer of the OSI 7 layer model, or a network interface of the TCP/IP protocol, or a physical layer of the mobile industry processor interface (MIPI) protocol, without limitation thereto. The physical layer of the MIPI protocol may be configured according to various predetermined specifications such as D-PHY, C-PHY, and/or M-PHY. Hereinafter, a case will be described as an example in which the first data transmitting unit TX1 and the first data receiving unit RX1 are configured according to the D-PHY specification of the physical layer of the MIPI protocol, without limitation thereto.

The transmission controller TXC and reception controller RXC may correspond to a network layer and a transport layer of the OSI 7 layer model, or Internet and transport of the TCP/IP protocol, or a protocol layer of the MIPI protocol. The protocol layer of the MIPI protocol may be configured according to various predefined specifications, such as a display serial interface (DSI) and/or a camera serial interface (CSI). Hereinafter, a case in which the transmission controller TXC and the reception controller RXC are configured according to the DSI specification of the protocol layer of the MIPI protocol will be described as an example.

The transmission controller TXC, the first data transmitting unit TX1, and the encoder ENC may be hardware-separated from each other, or two or more thereof may be hardware-integrated. Meanwhile, the transmission controller TXC, the first data transmitting unit TX1, and the encoder ENC may be software-separated from each other, or two or more thereof may be software-integrated. Meanwhile, the transmitter TXD may be configured as a part (hardware or software) of other controllers (e.g., an application processor (AP), a graphics processing unit (GPU), a central processing unit (CPU), or the like), and may be configured as independent hardware (e.g., a transmission-only IC).

The reception controller RXC, the first data receiving unit RX1, the decoder DEC, and the delay unit DLY may be hardware-separated from each other, or two or more thereof may be hardware-integrated. Meanwhile, the reception controller RXC, the first data receiving unit RX1, the decoder DEC, and the delay unit DLY may be software-separated from each other, or two or more thereof may be software-integrated. On the other hand, the receiver RXD may be configured as a part (e.g., hardware or software) of other controllers (e.g., a timing controller (TCON), a TCON embedded driver IC (TED), a driver IC (D-IC), or the like), and may be configured as independent hardware (e.g., reception-only IC).

The transmission controller TXC may provide first data (Data1) including a third payload (e.g., an original payload) to the encoder ENC. The encoder ENC may encode the first data (Data1) to generate first encoded data (eData1) including a first payload (e.g., an encoded payload) and to provide the encoded data (eData1) to the first data transmitting unit TX1. The first data transmitting unit TX1 may additionally transmit other data before and after the first encoded data (eData1) according to a predetermined protocol.

The first data receiving unit RX1 may generate a clock signal by using the first encoded data (eData1), and may sample data received through the first line dp1 and the second line dn1 based on the generated clock signal. For example, the first data receiving unit RX1 may include a clock data recovery circuit CDR, a de-serializer DES, a register REG, and the like. The first data receiving unit RX1 may provide second encoded data (eData2) including the same first payload as the first encoded data (eData1) to the decoder DEC. The decoder DEC may decode the second encoded data (eData2) to generate second data (Data2) including the same payload as the first data (Data1) and to transmit the second data (Data2) to the receiving controller RXC.

Meanwhile, the first data receiving unit RX1 may generate a plurality of control signals RxActiveHS, RxValidHS, RxSyncHS, and RxByteClkHS according to a protocol. In this case, the delay unit DLY may delay the plurality of control signals RxActiveHS, RxValidHS, RxSyncHS, and RxByteClkHS by a decoding time to provide the plurality of control signals to the reception controller RXC. Here, the decoding time may be a time required for the decoder DEC to decode the second encoded data (eData2) to generate the second data (Data2).

In addition, the control signal (RxByteClkHS) may be a clock signal for notifying a data transmission unit of a byte unit. For example, it may indicate that one byte of the second data (Data2) is transmitted substantially every one cycle of the control signal (RxByteClkHS). In addition, the control signal (RxByteClkHS) may be a clock signal used for data processing in the reception controller RXC. For example, the control signal (RxByteClkHS) may be an entire system clock for data processing after the de-serializer.

Meanwhile, the transceiver TSCV of FIG. 1 is exemplified as being configured of one data channel, but the transceiver TSCV may be configured of a plurality of data channels (e.g., four data channels) as shown in FIG. 2.

Referring to FIG. 2, the transmitter TXD may include second to fourth data transmission units TX2, TX3, and TX4 and corresponding encoders ENCb, ENCc, and ENCd. The receiver RXD may include second to fourth data reception units RX2, RX3, and RX4 and corresponding decoders DECb, DECc, and DECd. In addition, the receiver RXD may include a control signal generator CSG and a delay unit DLY.

The second data transmitting unit TX2 may be connected to the second data receiving unit RX2 through the first line dp2 and the second line dn2. The second data transmitting unit TX2 and the second data receiving unit RX2 may be referred to as a second data channel. The third data transmitting unit TX3 may be connected to the third data receiving unit RX2 through the first line dp3 and the second line dn3. The third data transmitting unit TX3 and the third data receiving unit RX3 may be referred to as a third data channel. The fourth data transmitting unit TX4 may be connected to the fourth data receiving unit RX4 through the first line dp4 and the second line dn4. The fourth data transmitting unit TX4 and the fourth data receiving unit RX4 may be referred to as a fourth data channel. A plurality of data channels may transmit and receive data independent of each other.

Since an operation of the encoders ENCb, ENCc, and ENCd encoding data (Data1b, Data1c, and Data1d) to generate encoded data (eData1b, eData1c, and eData1d) is substantially the same as the operation of the encoder ENC, substantially duplicate description may be omitted.

Since an operation of the decoders DECb, DECc, and DECd decoding the encoded data (eData2b, eData2c, and eData2d) to generate the data (Data2b, Data2c, and Data2d) is substantially the same as the operation of the decoder DEC, substantially duplicate description may be omitted.

The control signal generator CSG may generate the control signals RxActiveHS, RxValidHS, RxSyncHS, and RxByteClkHS by using data received by the second to fourth data receiving units RX2, RX3, and RX4. For example, the control signal generator CSG may align timing of data received by the second to fourth data receiving units RX2, RX3, and RX4, and may generate the control signals RxActiveHS, RxValidHS, RxSyncHS, and RxByteClkHS based on the aligned data.

The delay unit DLY may delay the plurality of control signals RxActiveHS, RxValidHS, RxSyncHS, and RxByteClkHS by a decoding time to provide the plurality of control signals to the reception controller RXC. Here, the decoding time may be a time required for the decoders DEC, DECb, DECc, and DECd to decode the second encoded data (eData2, eData2b, eData2c, and eData2d) to generate second data (Data2, Data2b, Data2c, and Data2d). For example, when the decoding times of the decoders DEC, DECb, DECc, and DECd are different, the delay unit DLY may delay the plurality of control signals RxActiveHS, RxValidHS, RxSyncHS, and RxByteClkHS based on the slowest decoding time.

Hereinafter, the transmitter will be described with reference to FIG. 3 and FIG. 4.

Figure 3:
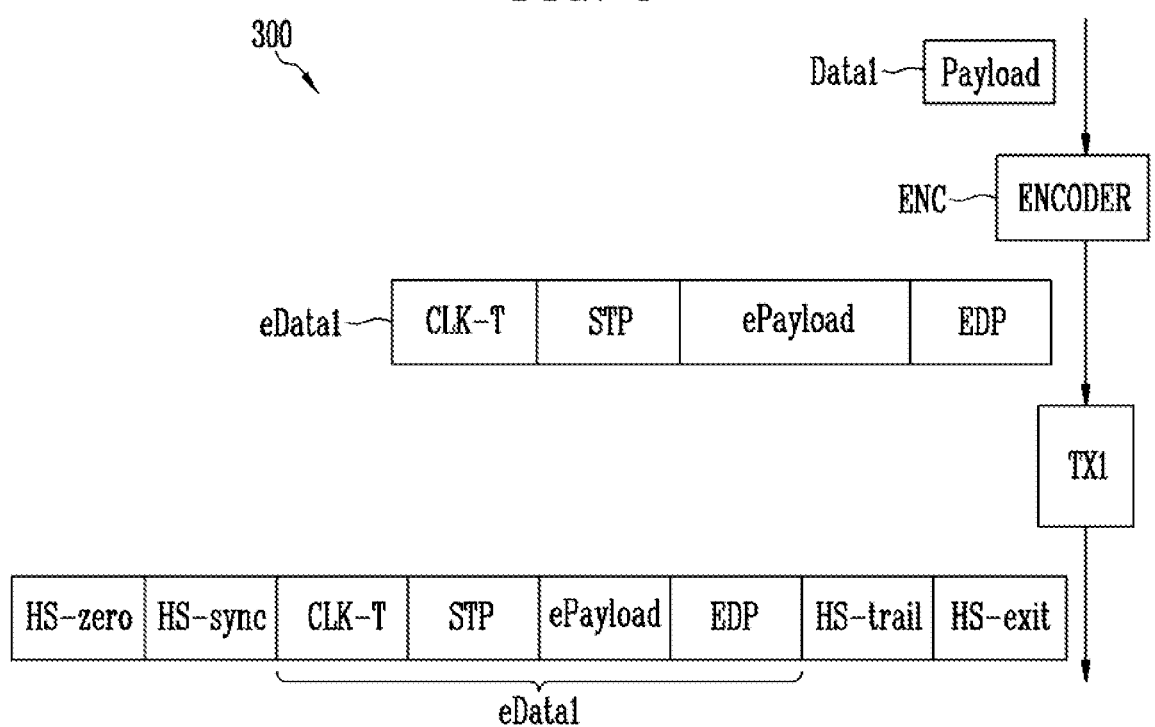
FIG. 3 is a hybrid diagram for explaining operations of a transmitter illustrated in FIG. 1 and FIG. 2.
Figure 4:
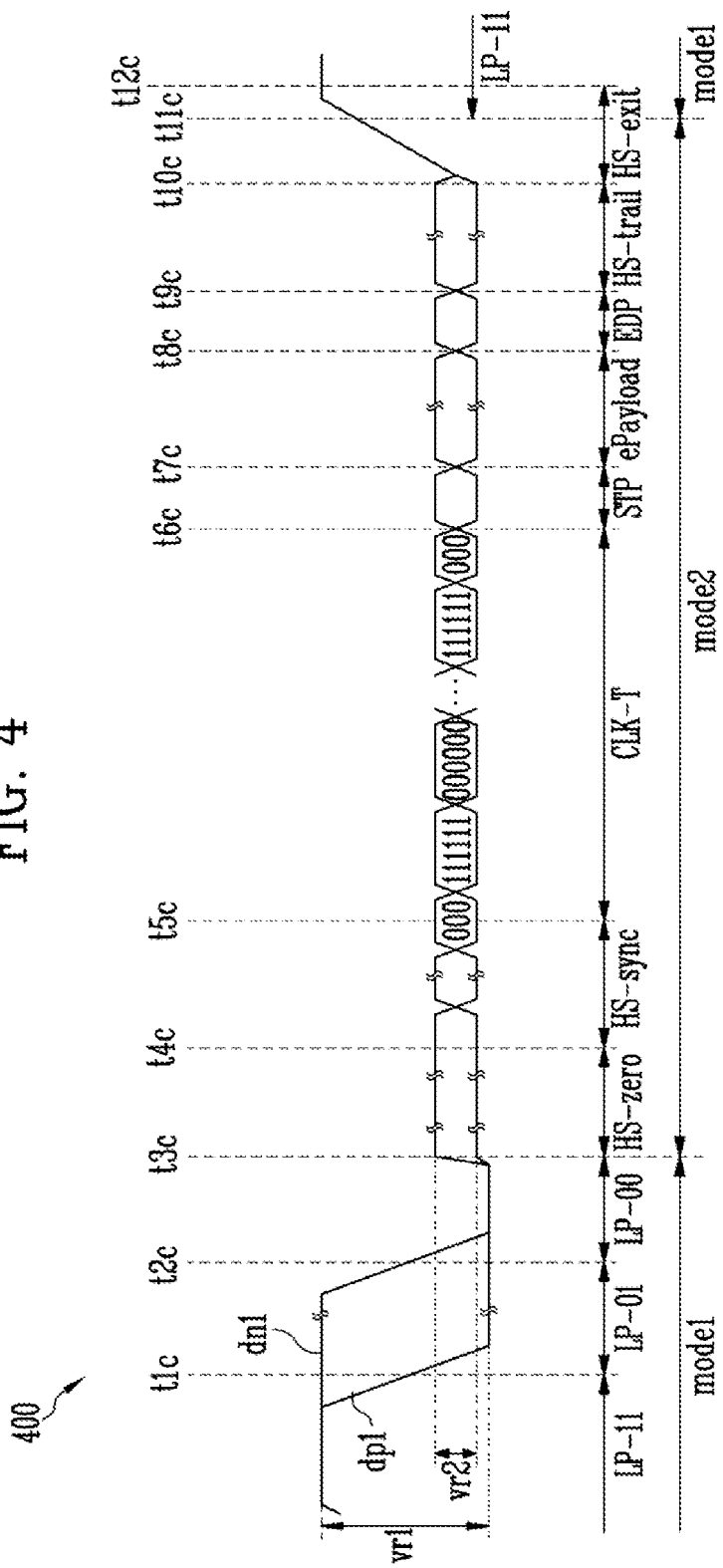
FIG. 4 is a timing diagram for explaining operations of a transmitter illustrated in FIG. 1 and FIG. 2.

FIG. 3 and FIG. 4 show operations of the transmitter illustrated in FIG. 1 and/or FIG. 2.

Referring to FIG. 3, a method 300 provides that the encoder ENC may receive the first data (Data1) including the third payload (Payload). The encoder ENC may encode the third payload (Payload) to generate a first payload (ePayload), and may add data before and after the first payload (ePayload) to generate the first encoded data (eData1). For example, the first encoded data (eData1) may sequentially include a clock training pattern CLK-T, a start pattern STP, a first payload (ePayload), and an end pattern EDP.

The clock training pattern CLK-T may include clock information. The receiver RXD may generate a clock signal having a specific frequency and a specific phase by using the clock information. For example, the clock training pattern CLK-T may be a pattern in which one '1' and one '0' are repeated (e.g., 01010101 . . . ). A clock signal generated in a clock data recovery circuit of the receiver RXD may be undesirably changed in frequency and phase by external factors (noise, temperature, or the like). The receiver RXD may correct the frequency and phase of the clock signal by using the clock training pattern CLK-T. In another example, the clock training pattern CLK-T may repeatedly include a plurality of consecutive 0s and a plurality of consecutive 1s (e.g., 0000111100001111 . . . ). In the embodiment, frequency information and phase information indicated by the clock training pattern CLK-T may vary according to the number of the plurality of consecutive 0s or the number of the plurality of consecutive 1s.

The start pattern STP may be a pattern indicating the start of transmission of the first payload (ePayload). The start pattern STP may be a pattern in which the encoded first payload (ePayload) cannot be included (=is use-prohibited). For example, the start pattern STP may be configured of 24b'011100_000000_111111_110001'.

The first payload (ePayload) may include clock information. For example, when there are many consecutive 0s or many consecutive 1s in the third payload (Payload), the signal transition is small, so that phase correction of the clock signal in the first data receiving unit RX1 may not be sufficiently performed, and skew of the clock signal may occur. Accordingly, the encoder ENC may encode the first payload (ePayload) to have more transitions (changed from 0 to 1 or changed from 0 to 1) compared to the third payload (Payload). According to the embodiment, the encoder ENC may encode each of transition ensuring data packets TGDP (refer to FIG. 7) included in the first payload (ePayload) to have at least one transition. This will be described in detail later with reference to FIG. 7 to FIG. 10.

The end pattern EDP may be a pattern indicating the end of transmission of the first payload (ePayload). For example, the end pattern EDP may be configured of 24b'011100_111111_000000_110001'. The end pattern EDP may be a pattern in which the encoded first payload (ePayload) cannot be included (=is use-prohibited).

The first data transmitting unit TX1 may receive the first encoded data (eData1) including the first payload (ePayload). The first data transmitting unit TX1 may additionally transmit other data before and after the first encoded data (eData1) according to a predetermined protocol. For example, when the predetermined protocol is the MIPI protocol, the first data transmitting unit TX1 may sequentially transmit a pattern (HS-zero), a pattern (HS-sync), the first encoded data (eData1), a pattern (HS-trail), and a pattern (HS-exit).

Referring to FIG. 4, the transmitter TXD (particularly, the first data transmitting unit TX1) may transmit signals 400 having a first voltage range vr1 at a first mode (mode1) to the first line dp1 and the second line dn1. Meanwhile, the transmitter TXD may transmit signals having a second voltage range vr2 smaller than the first voltage range vr1 at a second mode (mode2) to the first line dp1 and the second line dn1.

For example, an upper limit of the first voltage range vr1 may be larger than that of the second voltage range vr2, and a lower limit of the first voltage range vr1 may be smaller than that of the second voltage range vr2. When the MIPI protocol is applied to the transceiver TSCV, the first mode (mode1) may be a low power (LP) mode, and the second mode (mode2) may be a high speed (HS) mode.

In the first mode (mode1), the first line dp1 and the second line dn1 may be used in a single-ended manner. For example, signals respectively transmitted to the first line dp1 and the second line dn1 in the first mode mode1 may be the same or different from each other. Meanwhile, in the second mode (mode2), the first line dp1 and the second line dn1 may be used in a differential manner. For example, signals respectively transmitted to the first line dp1 and the second line dn1 in the second mode (mode2) are different from each other. The first line dp1 may be a positive line, and the second line dn1 may be a negative line.

In transmitting the first payload (ePayload) to the receiver RXD, the transmitter TXD is sequentially driven in the first mode (mode1), the second mode (mode2), and the first mode (mode1), and may transmit the clock training pattern CLK-T and the first payload (ePayload) in mode 2.

The transmitter TXD may transmit predefined patterns (e.g., a pattern LP-11, a pattern LP-01, and a pattern LP-00) to the first line dp1 and the second line dn1 so as to inform that the mode is switched from the first mode (mode1) to the second mode (mode2).

For example, the transmitter TXD may maintain signals applied to the first line dp1 and the second line dn1 before a time point t1c at a logic high level (the pattern LP-11). When a voltage level of the signal is larger than a predefined first threshold voltage level, it may be determined as a logic high level, and when the voltage level of the signal is smaller than a predefined second threshold voltage level, it may be determined as a logic low level. Next, the transmitter TXD, at the time point t1c, may change the signal of the first line dp1 to the logic low level and maintain the signal of the second line dn1 at the logic high level (e.g., the pattern LP-01). Next, the transmitter TXD, at a time point t2c, may maintain the signal of the first line dp1 at the logic low level and change the signal of the second line dn1 to the logic low level (e.g., the pattern LP-00).

Next, the transmitter TXD, in the second mode (mode2), may sequentially transmit the pattern (HS-zero), the pattern (HS-sync), the first encoded data (eData1), the pattern (HS-trail), and the pattern (HS-exit), which are described above. For example, the transmitter TXD may transmit the pattern (HS-zero) during a period t3c to t4c, transmit the pattern (HS-sync) during a period t4c to t5c, transmit the clock training pattern (CLK-T) for a period t5c to t6c, transmit the start pattern (STP) during a period t6c to t7c, transmit the first payload (ePayload) for a period t7c to t8c, transmit the end pattern (EDP) for a period t8c to t9c, transmit the pattern (HS-trail) for a period t9c to t10c, and transmit the pattern (HS-exit) after the time point t10c.

The pattern (HS-zero) may be a pattern for notifying a waiting period after entering from the first mode (mode1) to the second mode (mode2). For example, the pattern (HS-zero) may be a pattern in which 0 is repeated.

The pattern (HS-sync) may be a pattern indicating the start of transmission of the first encoded data (eData1). For example, the pattern (HS-sync) may have a value of 0xB8h or a value of 00011101.

The pattern (HS-trail) may be a pattern indicating the end of transmission of the first encoded data (eData1). The pattern (HS-trail) may be a pattern in which a value opposite to the last data of the first encoded data (eData1) is repeated. For example, when the last data (bit) of the first encoded data (eData1) is 0, the pattern (HS-trail) may be a pattern in which 1 is repeated. For example, when the last data (bit) of the first encoded data (eData1) is 1, the pattern (HS-trail) may be a pattern in which 0 is repeated.

The pattern (HS-exit) may be a pattern indicating that the second mode (mode2) ends and the first mode (mode1) starts. The pattern (HS-exit) is not configured of specific bits, but may be a transitional pattern in which a voltage increases to exceed the second voltage range vr2.

The transmitter TXD may change the signals applied to the first line dp1 and the second line dn1 to the logic high level from a time point t11c (e.g., the pattern LP-11). Accordingly, the transmitter TXD may inform that the second mode (mode2) is ended and the first mode (mode1) is started.

The receiver RXD may generate a clock signal by using the clock training pattern CLK-T and the first payload (ePayload). The first data receiving unit RX1 may include a clock data recovery circuit CDR (see FIG. 6), and may generate a clock signal having a specific frequency and phase by using the clock training pattern CLK-T. In addition, the first data receiving unit RX1 may continuously correct the phase of the clock signal so as to prevent the skew of the clock signal by using the first encoded data (eData1). The first data receiving unit RX1 may sample the received data by using the generated clock signal. Accordingly, the transceiver TSCV capable of communicating by using the MIPI protocol without a clock line may be provided.

Hereinafter, the receiver will be described with reference to FIG. 5 and FIG. 6.

Figure 5:
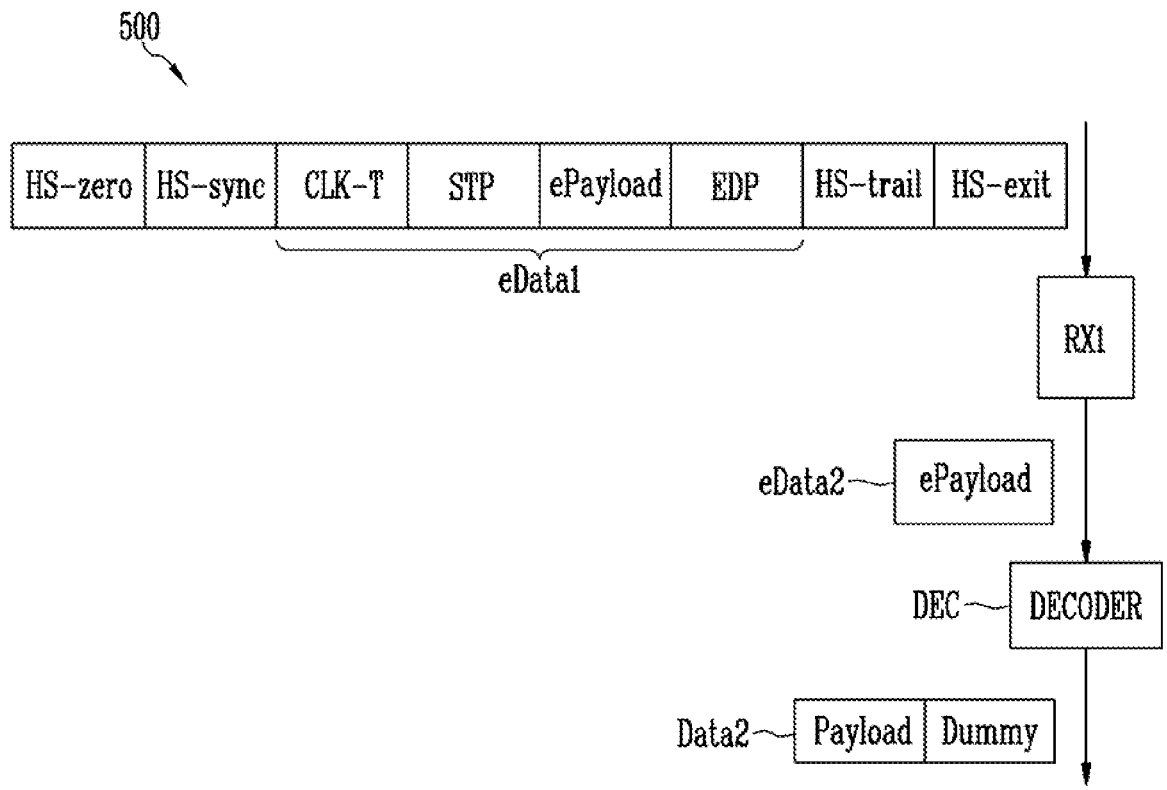
FIG. 5 is a hybrid diagram for explaining an operation of a receiver according to an embodiment of the present disclosure.
Figure 6:
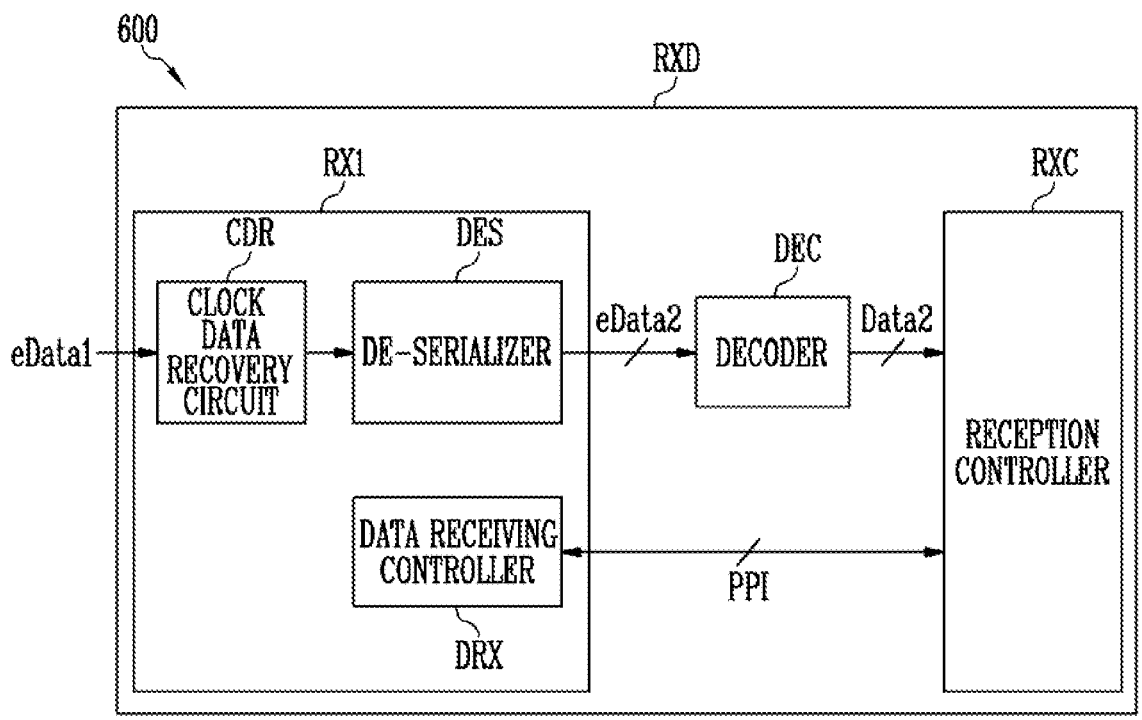
FIG. 6 is a schematic block diagram for explaining a configuration of a receiver according to an embodiment of the present disclosure.

FIG. 5 shows a method 500 for operation of a receiver according to an embodiment, and FIG. 6 shows an exemplary configuration 600 of a receiver RXD according to an embodiment, without limitation thereto. Hereinafter, these will be described with reference to FIG. 1 to FIG. 4, inclusive.

Referring to FIG. 5, the first data receiving unit RX1 may provide the second encoded data (eData2) including the first payload (ePayload) among the received data to the decoder DEC.

The decoder DEC may decode the second encoded data (eData2) (e.g., the first payload (ePayload)) to generate the second data (Data2), and may provide the generated second data (Data2) to the reception controller RXC. The second data (Data2) may include a second payload (Payload) and a dummy pattern (Dummy). The second payload (Payload) is the same as the third payload of the first data (Data1) provided by the transmission controller TXC.

The dummy pattern (Dummy) may be encoded in advance to be embedded in the first payload (ePayload) in the encoder ENC, or may be added in the decoder DEC. The dummy pattern (Dummy) may be data in which the same value is repeated. For example, when the last value of the second payload (Payload) is 0, the dummy pattern (Dummy) may be data in which 1 is repeated, and when the last value of the second payload (Payload) is 1, the dummy pattern (Dummy) may be data in which 0 is repeated.

Referring to FIG. 6, the first data receiving unit RX1 may include a clock data recovery circuit CDR, a de-serializer DES, and a data receiving controller DRX.

The clock data recovery circuit CDR may generate a clock signal corresponding to the received clock training pattern. For example, the clock data recovery circuit CDR may generate frequency information and phase information of the received training pattern. For example, the clock data recovery circuit CDR may receive the first clock training pattern, and may generate a first clock signal by using first frequency information and first phase information of the first clock training pattern.

The de-serializer DES may convert data outputted by a phase detector into a bus signal to output it. For example, the de-serializer DES may convert data outputted by the phase detector into a 2:24 bus signal.

The data receiving controller DRX may be an analog logic that may communicate with the reception controller RXC. The data receiving controller DRX may be included in the first data receiving unit RX1. The data receiving controller DRX may perform PHY protocol interface (PPI) communication with the reception controller RXC.

Hereinafter, a method in which the transmitter TXD converts and transmits each of transition ensuring data packets TGDP (see FIG. 7) included in the first payload (ePayload) to have at least one transition and the receiver RXD recovers the transition ensuring data packet TGDP (see FIG. 7) to an original data packet ADP (see FIG. 7) will be described with reference to FIG. 7 to FIG. 10.

Figure 7:
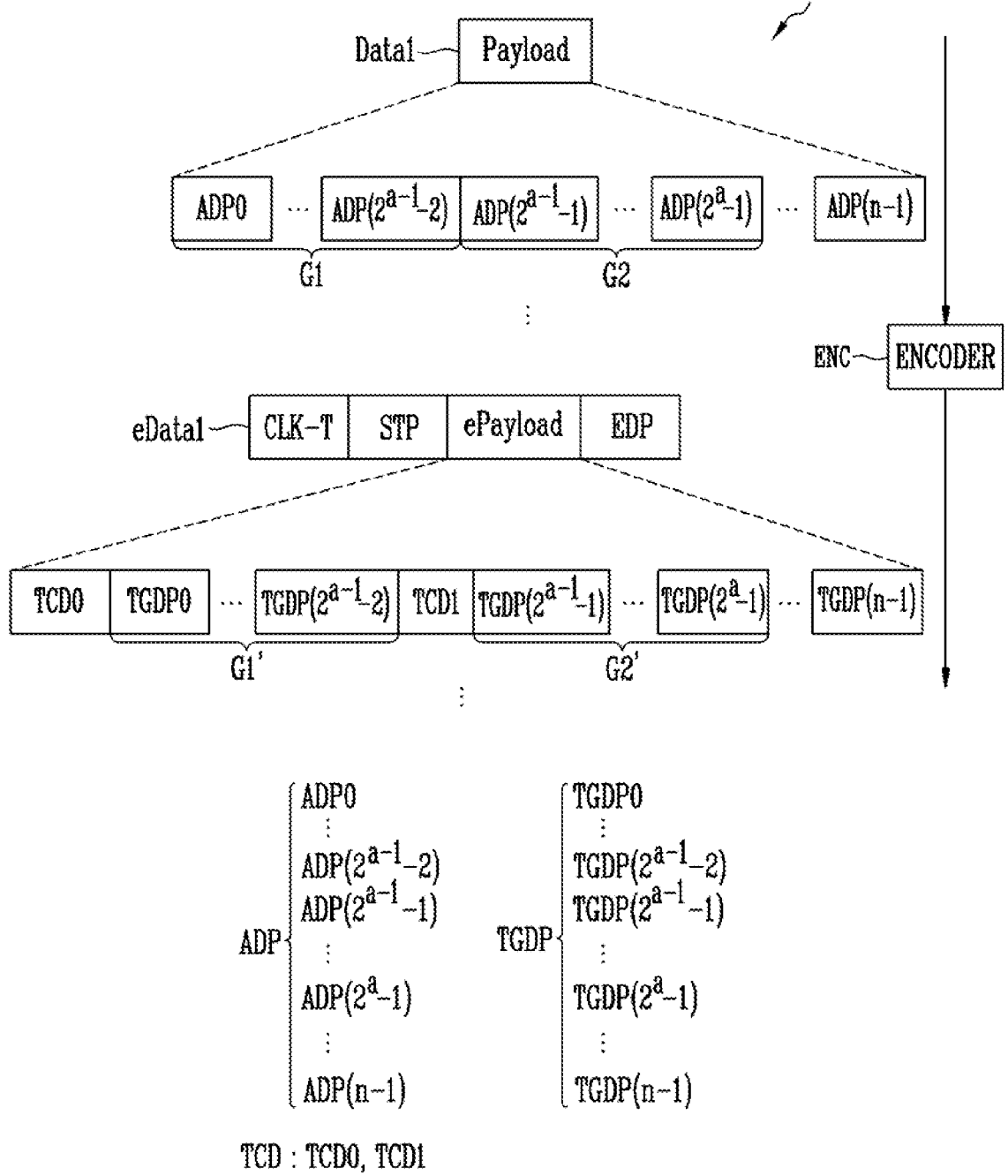
FIG. 7 is a hybrid diagram for explaining a method of converting a data packet into a transition ensuring data packet so that each data packet has at least one transition by an encoder illustrated in FIG. 3.
Figure 8:
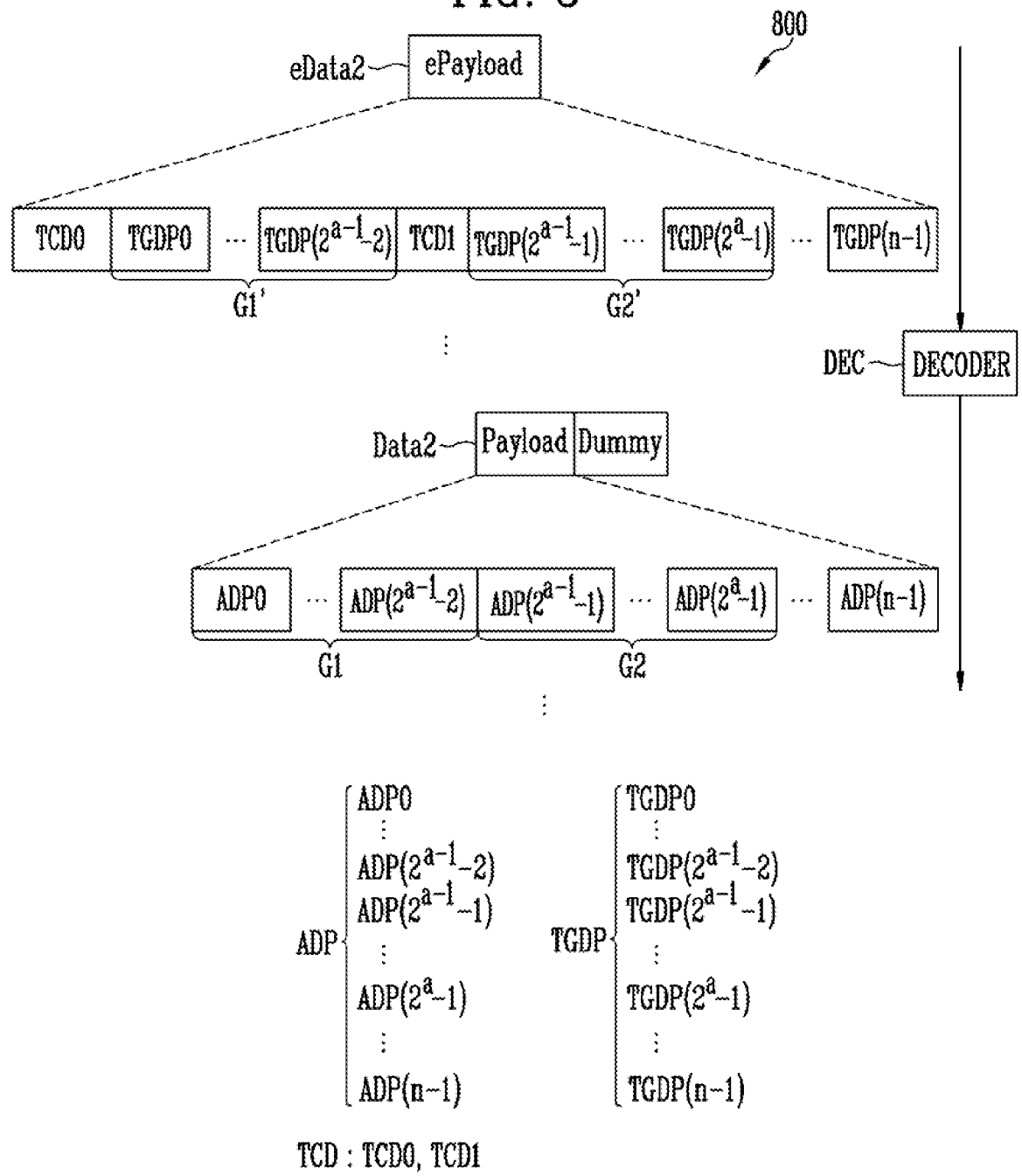
FIG. 8 is a hybrid diagram for explaining a method of recovering a transition ensuring data packet to an original data packet by a decoder illustrated in FIG. 5.
Figure 10:
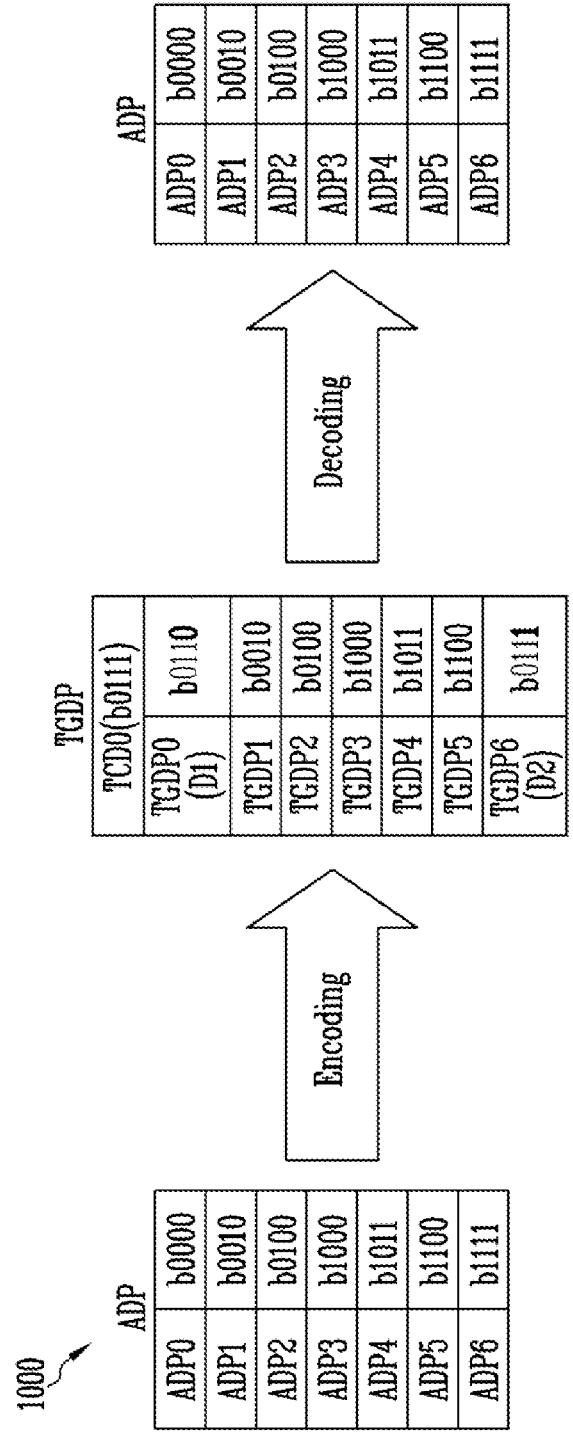
FIG. 10 is a tabular diagram for explaining a method of converting data packets into a transition ensuring data packet and recovering a transition ensuring data packet into data packets according to an embodiment of the present disclosure.

FIG. 7 shows a method 700 of converting a data packet into a transition ensuring data packet so that each data packet has at least one transition by the encoder illustrated in FIG. 3. FIG. 8 shows a method 800 of recovering a transition ensuring data packet to an original data packet by the decoder illustrated in FIG. 5. FIG. 9 shows a table 900 for explaining a method of determining a first transition facilitating data packet and a second transition facilitating data packet when a bit depth of a data packet is 'a'. FIG. 10 shows a method 1000 of converting data packets into a transition ensuring data packet and recovering a transition ensuring data packet into data packets.

In this case, FIG. 7 and FIG. 8 illustrate data packets ADP corresponding to one pixel row included in the first data (Data1), but the data packets ADP corresponding to a plurality of pixel rows may be further included in the first data (Data1). When the data packets ADP corresponding to the plurality of pixel rows are further included, a line blank pattern and a control signal pattern may be included in front and rear ends of the data packets ADP corresponding to each pixel row. Hereinafter, to promote understanding and ease of description, a data transmission method and a data recovery method will be described with reference to the data packets ADP corresponding to one pixel row included in the first data (Data1), without limitation thereto.

Referring to FIG. 7 and FIG. 9, the encoder ENC may encode the first data (Data1) to generate the first encoded data (eData1) including the first payload (e.g., the encoded payload).

A method of transmitting the first data (Data1) according to an embodiment may include: dividing the first data (Data1) into a plurality of data packets ADP having a bit depth of 'a'; determining a transition code TCD including a first transition facilitating data packet D1 and a second transition facilitating data packet D2 having the same high-order bits ([a−1:1]) among the data packets ADP; converting the plurality of data packets ADP into transition ensuring data packets TGDP by using the transition code TCD; and transmitting the transition code TCD and the transition ensuring data packets TGDP.

In an alternate embodiment, it shall be understood that the high-order bits ([a−1:1]) may comprise a plurality of bits in cases where 'a' is greater than two, but may comprise a single bit when 'a' is equal to two. In such a case, the term "high-order bits", as described and claimed, shall be read as "high-order bit". In general, the term "high-order bits ([a−1:1])" shall mean "high-order bit or bits ([a−1:1])", depending on the value of 'a' for each particular case.

First, the encoder ENC may divide the first data (Data1) into the plurality of data packets ADP having the bit depth of 'a'. In other words, the first data (Data1) may be divided into the plurality of data packets (ADP) having a bit number of 'a'. For example, the first data (Data1) having a total of a*n bits of may include n data packets (ADP0, ADP1, . . . , and ADP(n−1)) when divided by the bit number of 'a'.

When a bit depth of the data packet ADP is 'a', data values that may be expressed by the first data (Data1) are $2^a$. For example, when the bit depth of the data packet ADP is 4, the data values that may be expressed by the first data (Data1) are $2^4$=16. For example, when data values are expressed in units of the data packet ADP having the bit depth of 4, the first data (Data1) may be an array of data values selected within a range of 0 to 15 based on the decimal number.

Next, the encoder ENC may arbitrarily determine, among the plurality of data packets ADP, the first transition facilitating data packet D1 and the second transition facilitating data packet D2 having the same high-order bits ([a−1:1]). In this case, when it is determined as the first transition facilitating data packet D1 and the second transition facilitating data packet D2, it may not be included in groups G1 and G2 of the data packet ADP converted into the transition ensuring data packet TGDP. For example, when 0 (e.g., 0000) and 1 (e.g., 0001) are determined as the first transition facilitating data packet D1 and the second transition facilitating data packet D2, 0 (e.g., 0000) and 1 (e.g., 0001) are not included in the groups G1 and G2 of the data packets ADP that are converted into the transition ensuring data packet TGDP. In addition, when 14 (e.g., 1110) and 15 (e.g., 1111) are determined as the first transition facilitating data packet D1 and the second transition facilitating data packet D2, 14 (e.g., 1110) and 15 (e.g., 1111) are not included in the groups of the data packets ADP that are converted into the transition ensuring data packet TGDP.

When the high-order bits ([a−1:1]) among the plurality of data packets ADP are the same, since it may be determined as the first transition facilitating data packet D1 and the second transition facilitating data packet D2, in the table shown in FIG. 9, respective pairs of 0 (e.g., 0000) and 1 (e.g., 0001), 2 (e.g., 0010) and 3 (e.g., 0011), 4 (e.g., 0100) and 5 (e.g., 0101), 6 (e.g., 0110) and 7 (e.g., 0111), 8 (e.g., 1000) and 9 (e.g., 1001), 10 (e.g., 1010) and 11 (e.g., 1011), 12 (e.g., 1100) and 13 (e.g., 1101), and 14 (e.g., 1110) and 15 (e.g., 1111) may be a candidate for the first transition facilitating data packet D1 and the second transition facilitating data packet D2.

The determining of the transition code TCD, when the bit depth of the data packet ADP is 'a', may further include grouping the data packets ADP so as to include $2^{a-1}-1$ data packets (ADP) per one transition code TCD.

In other words, when the bit depth of the data packet ADP is 'a', this is a minimum condition for necessarily including the first transition facilitating data packet D1 and the second transition facilitating data packet D2 among the data values (e.g., $2^a$) that may be expressed by the first data (Data1), even if the high-order bits ([a−1:1]) of the data packets ADP that do not exist in the data packets ADP converted into the transition ensuring data packet TGDP are all different, when there is no more data packet ADP, the first transition facilitating data packet D1 and the second transition facilitating data packet D2 having the same high-order bits ([a−1:1]) may be determined.

Referring to FIG. 9, when data packets ADP that do not exist in the data packets ADP that are converted into the transition ensuring data packet TGDP are 1, 2, 5, 7, 9, 10, 13, and 14, there is no data packet ADP having the same high-order bits ([3:1]). In this case, when 7 and the high-order bits ([3:1]) do not additionally include the same 6 as 011, 6 may be determined as the first transition facilitating data packet D1, and 7 may be determined as the second transition facilitating data packet D2. For example, when the bit depth of the data packet ADP is 4, the number of data packets ADP included in the data packets ADP converted into the transition ensuring data packet TGDP is 7, and the number of data packets ADP that are not included therein is 9.

Since the transition code TCD is transmitted to the receiver RXD (see FIG. 2) together with the transition ensuring data packets TGDP, the transition code TCD itself needs to have at least one transition in two adjacent bits.

According to the embodiment, the transition code TCD may set the least significant bit ([0]) as a complement of one of the bits included in the same high-order bits ([a−1:1]) of the first transiting facilitation data packet D1 and the second transition facilitating data packet D2. For example, as described above, when 6 (e.g., 0110) and 7 (e.g., 0111) are determined as the first transition facilitating data packet D1 and the second transition facilitating data packet D2, the encoder ENC sets 1 corresponding to a complement of 0 that is the most significant bit ([3]) of bits 0, 1, and 1 included in the high-order bits ([3:1]) (e.g., 011) of the first transition facilitating data packet D1 and the second transition facilitating data packet D2, as the least significant bit ([0]), so that the transition code TCD may be determined as 0111.

Meanwhile, when 0 (e.g., 0000) and 1 (e.g., 0001) are determined as the first transition facilitating data packet D1 and the second transition facilitating data packet D2, the encoder ENC sets 1 corresponding to a complement of 0 that is the second high-order bit ([2]) of bits 0, 0, and 0 included in the high-order bits ([3:1]) (e.g., 000) of the first transition facilitating data packet D1 and the second transition facilitating data packet D2, as the least significant bit ([0]), so that the transition code TCD may be determined as 0001. As such, even if the high-order bits ([3:1]) of the first transition facilitating data packet D1 and the second transition facilitating data packet D2 corresponds to 000 so that there is no transition, by setting a complement of one of the bits included in the high-order bits ([3:1]) as the least significant bit ([0]), at least one transition may be included in two adjacent bits included in the data packet ADP.

Similarly, when 14 (e.g., 1110) and 15 (e.g., 1111) are determined as the first transition facilitating data packet D1 and the second transition facilitating data packet D2, the encoder ENC sets 0 corresponding to a complement of 1 that is the third high-order bit ([1]) of bits 1, 1, and 1 included in the high-order bits ([3:1]) (e.g., 111) of the first transition facilitating data packet D1 and the second transition facilitating data packet D2, as the least significant bit ([0]), so that the transition code TCD may be determined as 1110. As such, even if the high-order bits ([3:1]) of the first transition facilitating data packet D1 and the second transition facilitating data packet D2 corresponds to 111 so that there is no transition, by setting a complement of one of the bits included in the high-order bits ([3:1]) as the least significant bit ([0]), at least one transition may be included in two adjacent bits included in the data packet ADP.

Next, the encoder ENC may convert a grouped plurality of data packets ADP into the transition ensuring data packets TGDP by using the transition code TCD. In this case, a plurality of data packets ADP0 to ADP($2^{a-1}-2$) of the first group G1 may be converted into a plurality of transition ensuring data packets (e.g., TGDP0 to TGDP ($2^{a-1}-2$)) of a 1'-th group G1' by using the first transition code TCD0, and a plurality of data packets (ADP($2^{a-1}-1$) to ADP($2^{a}-1$)) of the second group G2 may be converted into a plurality of transition ensuring data packets (e.g., TGDP($2^{a-1}-1$) to TGDP($2^{a}-1$)) of a 2'-th group G2' by using the second transition code TCD1. As such, the n data packets ADP may be converted into the transition ensuring data packets TGDP in units of groups (e.g., G1 and G2) by using each transition code TCD.

According to the embodiment, when a data packet ADP not including a transition exists among the plurality of data packets ADP, it may be converted into the transition ensuring data packet TGDP including a transition by using the transition code TCD. When all bits of the data packet ADP including no transition are 0, it is converted into the first transition facilitating data packet D1, and when all bits of the data packet ADP including no transition are 1, it may be converted into the second transition facilitating data packet D2. Meanwhile, the data packet ADP including a transition among the plurality of data packets ADP may be converted into the transition ensuring data packet TGDP having the same value.

Referring to FIG. 9 and FIG. 10, it is assumed that the first transition facilitating data packet D1 is 6 (e.g., 0110) and the second transition facilitating data packet D2 is 7 (e.g., 0111). Since all bits of the first data packet ADP0 are 0, the first data packet ADP0 is converted into the first transition facilitating data packet D1. In other words, 6 (b0110) is determined as the first transition ensuring data packet TGDP0. In this case, the first data packet ADP0 in which all bits thereof are 0 may correspond to data representing a black grayscale. The least significant bit ([0]) of the first transition facilitating data packet D1 may be 0.

Since all of the second data packet ADP1, the third data packet ADP2, the fourth data packet ADP3, the fifth data packet ADP4, and the sixth data packet ADP5 include at least one transition in two adjacent bits, the bits are converted into the second transition ensuring data packet TGDP1, the third transition ensuring data packet TGDP2, the fourth transition ensuring data packet TGDP3, the fifth transition ensuring data packet TGDP4, and the sixth transition ensuring data packet TGDP5 that have the same value.

Since all bits of the seventh data packet ADP6 are 0, the seventh data packet ADP6 is converted into the second transition facilitating data packet D2. In other words, 7 (b0111) is determined as the seventh transition ensuring data packet TGDP6. In this case, the seventh data packet ADP6 in which all bits thereof are 1 may correspond to data representing a white grayscale. The least significant bit ([0]) of the second transition facilitating data packet D2 may be 1.

For this reason, all of the transition ensuring data packets TGDP may include at least one transition in two adjacent bits.

Referring to FIG. 7 to FIG. 9, the decoder DEC may decode the second encoded data (eData2) to generate the second data (Data2) including the same payload as the first data (Data1). The second encoded data (eData2) may include the same first payload as the first encoded data (eData1).

A method of recovering the second data (Data2) according to an embodiment may include: receiving the transition code TCD and the transition ensuring data packets TGDP; and recovering the transition ensuring data packets TGDP into the data packets ADP by using the transition code TCD. In this case, the plurality of data packets ADP has the bit depth of 'a', and the transition code TCD may include the first transition facilitating data packet D1 and the second transition facilitating data packet D2 having the same high-order bits ([a-1:1]) among the data packets ADP.

First, the decoder DEC may receive the transition code TCD and the transition ensuring data TGDP from the transmitter TXD (see FIG. 1). The transition code TCD and the transition ensuring data TGDP are received in units of groups (e.g., G1' and G2'), and the groups (e.g., G1' and G2') may include $2^{a-1}-1$ transition ensuring data (e.g., TGDP0 to TGDP($2^{a-1}-1$)) per one transition code (e.g., TCD0).

Next, the decoder DEC compares the transition ensuring data TGDP with the transition code TCD, and when the high-order bits ([a-1:1]) of the transition ensuring data TGDP is the same as the high-order bits ([a-1:1]) of the transition code TCD and when the least significant bit ([0]) of the transition ensuring data TGDP is 0, it may be converted into the data packet AGP in which all bits thereof are 0, and when the high-order bits ([a-1:1]) of the transition ensuring data TGDP is the same as the high-order bits ([a-1:1]) of the transition code TCD and when the least significant bit ([0]) of the transition ensuring data TGDP is 1, it may be converted into the data packet in which all bits thereof are 1. On the other hand, when the high-order bits ([a-1:1]) of the transition ensuring data TGDP is not the same as the high-order bits ([a-1:1]) of the transition code TCD, it may be converted into the data packet AGP having the same value as the transition guarantee data TGDP.

Referring to FIG. 9 and FIG. 10, the high-order bits ([3:1]) of the first transition ensuring data packet TGDP0 is 011, the high-order bits ([3:1]) of the first transition code TCD0 is also 011, and the least significant bit ([0]) of the first transition ensuring data packet TGDP0 is 0, thus it is converted into the first data packet AGP0 in which bits are 0. In this case, the first data packet ADP0 in which all bits thereof are 0 may correspond to data representing a black grayscale.

Respective high-order bits ([3:1]) of the second transition ensuring data packet TGDP1, the third transition ensuring data packet TGDP2, the fourth transition ensuring data packet TGDP3, the fifth transition ensuring data packet TGDP4, and the sixth transition ensuring data packet TGDP5 are 001, 010, 100, 101, and 110, and thus since the high-order bits are not the same as 011 that is the upper bits ([3:1]) of the first transition code TCD0, the high-order bits are converted into the second data packet ADP1, the third data packet ADP2, the fourth data packet ADP3, the fifth data packet ADP4, and the sixth data packet ADP5 respectively having the same value as the second transition ensuring data packet TGDP1, the third transition ensuring data packet TGDP2, the fourth transition ensuring data packet TGDP3, the fifth transition ensuring data packet TGDP4, and the sixth transition ensuring data packet TGDP5.

The high-order bits ([3:1]) of the seventh transition ensuring data packet TGDP6 is 011, the high-order bits ([3:1]) of the transition code (e.g., TCD0) is also 011, and the least significant bit ([0]) of the seventh transition ensuring data packet TGDP6 is 1, thus it is converted into the seventh data packet AGP6 in which all bits are 1. In this case, the seventh data packet ADP6 in which all bits thereof are 1 may correspond to data representing a white grayscale.

As described above, according to the data transmission method and the data recovery method according to the embodiment of the present application, it is possible to ensure the transition of data transmitted through a simple algorithm instead of a complex logical operation.

While this disclosure has been provided in connection with what are presently considered to be practical embodiments, it is to be understood that the covered invention is not limited to the disclosed embodiments, but, on the contrary, is intended to cover various modifications and equivalent arrangements included within the spirit and scope of the appended claims. Therefore, those of ordinary skill in the pertinent art will understand that various modifications and other equivalent embodiments of the present disclosure are possible. Consequently, the true technical protective scope of the present disclosure shall be determined based on the technical scope and spirit of the appended claims.

What is claimed is:

1. A data transmission method that transmits data in a clock-embedded manner, comprising:
dividing the data into a plurality of data packets each having a bit number of 'a', where 'a' is greater than one;
determining a transition code including information on a first transition facilitating data packet and a second transition facilitating data packet having the same high-order bit or bits ([a−1:1]) among the data packets;
converting the plurality of data packets into transition ensuring data packets by using the transition code; and
transmitting the transition code and the transition ensuring data packets.

2. The data transmission method of claim 1, wherein:
when the bit number is 'a', the number of data values that is representable by the data is 2a.

3. The data transmission method of claim 1, wherein:
the determining of the transition code further includes
grouping the data packets to include 2a−1−1 of the data packets per one transition code.

4. The data transmission method of claim 3, wherein:
the first transition facilitating data packet and the second transition facilitating data packet are not included in a group of the data packet.

5. The data transmission method of claim 1, wherein:
in the transition code, the least significant bit ([0]) is set as a complement of one of bits included in the high-order bit or bits ([a−1:1]).

6. The data transmission method of claim 1, wherein:
the bit number 'a' is greater than two,
the converting of the plurality of data packets into the transition ensuring data packets includes:
in a case in which a data packet not including a transition among the plurality of data packets exists, converting the data packet into the first transition facilitating data packet when all bits of the data packet not including the transition are 0, and converting the data packet into the second transition facilitating data packet when all bits of the data packet not including the transition are 1.

7. The data transmission method of claim 6, wherein
the data packet in which all the bits are 0 corresponds to data displaying a black grayscale, and the data packet in which all the bits are 1 corresponds to data displaying a white grayscale.

8. The data transmission method of claim 6, wherein
the least significant bit ([0]) of the first transition facilitating data packet is 0, and the least significant bit ([0]) of the second transition facilitating data packet is 1.

9. The data transmission method of claim 6, wherein
the converting of the plurality of data packets into the transition ensuring data packets includes
converting a data packet including a transition among the plurality of data packets into a transition ensuring data packet having the same value.

10. A data recovery method that recovers data transmitted in a clock-embedded manner, comprising:
as a method of recovering transition ensuring data to data packets,
receiving a transition code and the transition ensuring data packets; and
recovering the transition ensuring data packets to the data packets by using the transition code,
wherein the number of bits of each of the plurality of data packets is 'a', where 'a' is greater than one, and
wherein the transition code includes a first transition facilitating data packet and a second transition facilitating data packet having the same high-order bit or bits ([a−1:1]) among the data packets.

11. The data recovery method of claim 10, wherein:
in the transition code, the least significant bit ([0]) is set as a complement of one of bits included in the high-order bit or bits ([a−1:1]).

12. The data recovery method of claim 10, wherein:
the number of bits 'a' is greater than two,
the recovering of the transition ensuring data packets to the data packets includes:
comparing the transition ensuring data with the transition code;
converting the transition ensuring data into a data packet in which all bits thereof are 0, when the high-order bits ([a−1:1]) of the transition ensuring data is the same as the high-order bits ([a−1:1]) of the transition code and when the least significant bit ([0]) of the transition ensuring data is 0; and
converting the transition ensuring data into a data packet in which all bits thereof are 1, when the high-order bits ([a−1:1]) of the transition ensuring data is the same as the high-order bits ([a−1:1]) of the transition code and when the least significant bit ([0]) of the transition ensuring data is 1.

13. The data recovery method of claim 12, wherein
the data packet in which all the bits are 0 corresponds to data displaying a black grayscale, and the data packet in which all the bits are 1 corresponds to data displaying a white grayscale.

14. The data recovery method of claim 12, wherein
the recovering of the transition ensuring data packets to the data packets includes
converting the transition ensuring data packets into a data packet having the same value as the transition ensuring data when the high-order bits ([a−1:1]) of the transition ensuring data is not the same as the high-order bits ([a−1:1]) of the transition code.

15. The data recovery method of claim 10, wherein
when the number of the bits is 'a', the number of data values that is representable by the data is 2a.

16. The data recovery method of claim 15, wherein
in the receiving of the transition code and the transition ensuring data,
the transition code and the transition ensuring data are received in units of groups, and the group includes 2a−1−1 of the transition ensuring data per one transition code.

17. A transceiver comprising:
a transmitter including a transmission controller, at least one encoder connected to the transmission controller, and at least one transmitter unit connected to the at least one encoder, respectively; and
a receiver coupled in signal communication with the transmitter, the receiver including at least one receiver unit, at least one decoder connected to the at least one receiver unit, respectively, and a reception controller connected to the at least one decoder,
wherein the at least one encoder is configured to divide clock-embedded data into a plurality of data packets each having a bit number of 'a', where 'a' is greater than one, determine a transition code including information on a first transition facilitating data packet and a second transition facilitating data packet having the same high-order bit or bits ([a−1:1]) among the data packets, and convert the plurality of data packets into transition ensuring data packets by using the transition code.

18. The transceiver of claim 17,
wherein the at least one transmitter unit is configured to transmit the transition code and the transition ensuring data packets.

19. The transceiver of claim 18,
wherein the at least one receiver unit is configured to receive a transition code and the transition ensuring data packets,
wherein the at least one decoder unit is configured to recover the transition ensuring data packets to the data packets by using the transition code,
wherein the number of bits of each of the plurality of data packets is 'a',
wherein 'a' is greater than one,
wherein the transition code includes a first transition facilitating data packet and a second transition facilitating data packet having the same high-order bit or bits ([a−1:1]) among the data packets.

20. The transceiver of claim 19, wherein the number of bits 'a' is greater than two.

* * * * *